(12) United States Patent
Lo

(10) Patent No.: US 10,484,004 B2
(45) Date of Patent: Nov. 19, 2019

(54) DELTA-SIGMA MODULATOR

(71) Applicant: MEDIATEK Inc., Hsinchu (TW)

(72) Inventor: Tien-Yu Lo, Hsinchu (TW)

(73) Assignee: MEDIATEK INC., Hinchu (TW)

( * ) Notice: Subject to any disclaimer, the term of this patent is extended or adjusted under 35 U.S.C. 154(b) by 0 days.

(21) Appl. No.: 16/151,404

(22) Filed: Oct. 4, 2018

(65) Prior Publication Data

US 2019/0288705 A1 Sep. 19, 2019

Related U.S. Application Data

(60) Provisional application No. 62/643,204, filed on Mar. 15, 2018.

(51) Int. Cl.
*H03M 3/00* (2006.01)

(52) U.S. Cl.
CPC ............. *H03M 3/464* (2013.01); *H03M 3/37* (2013.01); *H03M 3/43* (2013.01); *H03M 3/438* (2013.01)

(58) Field of Classification Search
CPC ........ H03M 3/464; H03M 3/438; H03M 3/37; H03M 3/43; H03M 3/46
USPC .......................... 341/143, 144, 155, 161, 172
See application file for complete search history.

(56) References Cited

U.S. PATENT DOCUMENTS

| | | | |
|---|---|---|---|
| 9,035,814 B2* | 5/2015 | Chang | H03M 3/30 341/143 |
| 9,325,341 B2* | 4/2016 | Dagher | H03M 3/30 |
| 9,455,737 B1 | 9/2016 | Rajaee et al. | |
| 9,577,662 B2* | 2/2017 | Wei | H03M 3/37 |

OTHER PUBLICATIONS

Wang, et al.: "Design Techniques for Wideband Discrete-Time Delta-Sigma ADCs With Extra Loop Delay"; IEEE Transactions on Circuits and Systems—I: Regular Papers, vol. 58, No. 7, Jul. 2011; pp. 1518-1530.
Meng, et al.: "Low-Distortion Wideband Delta-Sigma ADCs With Shifted Loop Delays"; IEEE Transactions on Circuits and Systems—I: Regular Papers, vol. 62, No. 2, Feb. 2015; pp. 376-384.

* cited by examiner

*Primary Examiner* — Khai M Nguyen
(74) *Attorney, Agent, or Firm* — McClure, Qualey & Rodack, LLP

(57) ABSTRACT

A delta-sigma modulator comprising: a first loop filter for filtering a first signal to a second signal, a second loop filter for filtering a third signal, a comparator, a register coupled to the comparator, a first capacitor bank and a second capacitor bank parallelly coupled between the second loop filter and the comparator, a first path causing a delayed signal to be linearly combined with an input signal to form the first signal, and a second path causing the delayed signal to be linearly combined with the second signal to form the third signal, wherein the delayed signal may be formed by delaying an output signal of the register.

22 Claims, 5 Drawing Sheets

US 10,484,004 B2

DELTA-SIGMA MODULATOR

This application claims the benefit of U.S. provisional application Ser. No. 62/643,204, filed Mar. 15, 2018, the subject matter of which is incorporated herein by reference.

FIELD OF THE INVENTION

The present invention relates to a delta-sigma modulator (DSM), and more particularly, to a DSM which may utilize a quantization of single-comparator time-interleaved successive approximation and a feedback delayed by one sampling period to achieve high speed and high quantization resolution by circuitry of low speed, low power, low cost, low layout area and low complexity, and may further utilize a feedback value restoring mechanism to compensate a signal transfer function affected by the delayed feedback.

BACKGROUND OF THE INVENTION

Modern electronic devices, such as mobile phones for cutting-edge wireless telecommunication, require to perform advanced signal processing of high speed and/or high throughput. While DSM is a broadly utilized building block for signal processing, it is difficult for DSM of conventional architecture to meet demands of advanced signal processing.

SUMMARY OF THE INVENTION

An object of the invention is providing a DSM (e.g., 200) which may include a first loop filter (e.g., 201) for filtering a first signal (e.g., S1) to a second signal (e.g., S2), a second loop filter (e.g., 202) for filtering a third signal (e.g., S3), a comparator (e.g., 230), a register (e.g., 240) coupled to the comparator, a first capacitor bank (e.g., 221) and a second capacitor bank (e.g., 222), a first path (e.g., 251) and a second path (e.g., 252).

An object of the invention is providing a DSM (e.g., 200) which may include: a first sum circuit (e.g., 211), a first loop filter, a second sum circuit (e.g., 212), a second loop filter, a third sum circuit (e.g., 213), a first capacitor bank, a second capacitor bank, a first front switch (e.g., sa1), a second front switch (e.g., sa2), a first back switch (e.g., sb1), a second back switch (e.g., sb2), a comparator, a register and a delay circuit (e.g., 250).

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
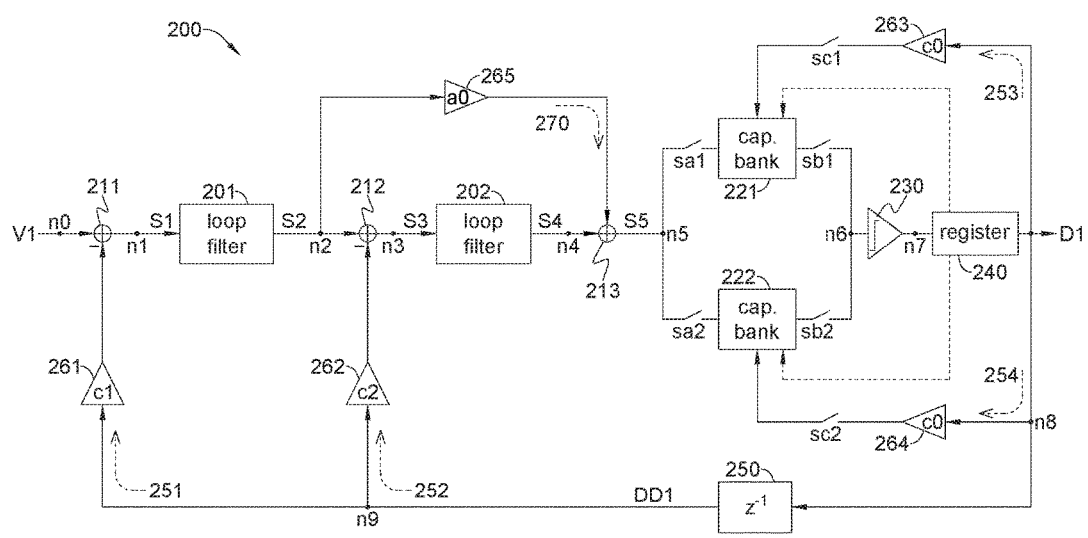
FIG. 1 illustrates a DSM according to an embodiment of the invention.

Please refer to FIG. 1 illustrating a DSM 200 according to an embodiment of the invention. The DSM 200 may convert an input signal V1 at a node n0 to an output signal D1 at a node n8 by a signal transfer function, with noise (e.g., including quantization noise) shaped by a noise transfer function. For example, the signal V1 may be a continuous-time analog signal, while the signal D1 may be a discrete-time digital signal sampled at a sampling period Ts.

As shown in FIG. 1, the DSM 200 may include two loop filters 201 and 202, two capacitor banks 221 and 222, a comparator 230, a register 240, a feedforward path 270, feedback paths 251, 252, 253 and 254, along with a delay circuit 250, switches sa1, sb1, sc1, sa2, sb2 and sc2, sum circuits 211, 212 and 213, and scalers 261, 262, 263, 264 and 265.

The sum circuit 211 may have two inputs and an output respectively coupled to the node n0, a node n9 (via the scaler 261) and a node n1. The loop filter 201 may have an input and an output respectively coupled to the node n1 and a node n2, and the loop filter 201 may filter a signal S1 at the node n1 to a signal S2 at the node n2. The loop filter 202 may have an input and an output respectively coupled to nodes n3 and n4, and the loop filter 202 may filter a signal S3 at the node n3 to a signal S4 at the node n4. The sum circuit 213 may have two inputs and an outputs respectively coupled to the nodes n2 (via the scaler 265), n4 and a node n5. The feedforward path 270 between the outputs of the loop filters 201 and 202 may cause the signal S2 to be scaled by a factor a0 (e.g., a constant) of the scaler 265 and to be fed forward to the sum circuit 213, so the sum circuit 213 may linearly combine the signals S2 and S4 to form the signal S5 at the node n5.

Figure 2A:
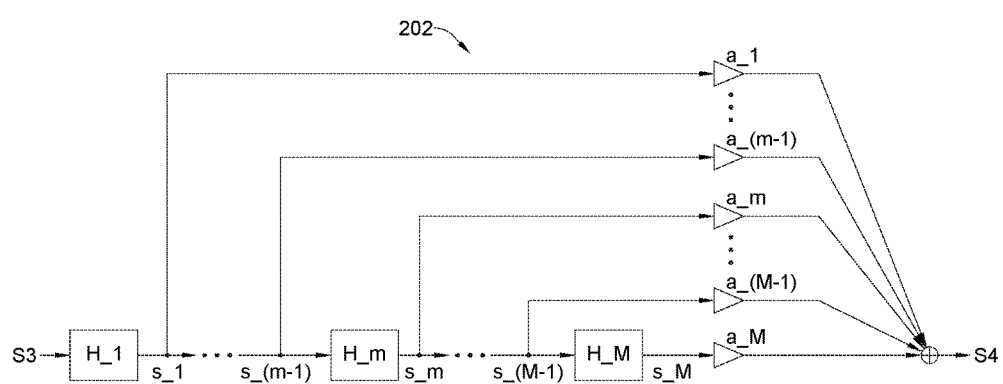
FIG. 2a and FIG. 2b illustrate implementation examples of portions of the DSM in FIG. 1.

In an embodiment, the loop filter 201 may be a first-order integrator, and the loop filter 202 may be a first-order or a high-order integrator, and may include one or more first-order integrators. For example, as shown in FIG. 2a, the loop filter 202 may include a cascaded chain of M filters $H\_1$ to $H\_M$, along with feedforward scalers $a\_1$ to $a\_M$, wherein the integer M may be greater than or equal to 1. The filter $H\_1$ may filter the signal S3 to a signal $s\_1$, and each subsequent filter $H\_m$ (for m=2 to M) may filter a signal $s\_(m-1)$ to a signal $s\_m$. The signals $s\_1$ to $s\_M$ may be respectively weighted by the scalers $a\_1$ to $a\_M$ and summed to form the signal S4. Each of the filters $H\_1$ to $H\_M$ may be a first-order integrator.

As shown in FIG. 1, the capacitor banks 221 and 222 may be parallelly coupled between the loop filter 202 and the comparator 230 via the switches sa1, sb1, sa2 and sb2. The switch sa1 may be coupled between the node n5 and the capacitor bank 221. The switch sa2 may be coupled between the node n5 and the second capacitor bank 222. The switch sb1 may be coupled between the capacitor bank 221 and a node n6. The switch sb2 may be coupled between the capacitor bank 222 and the node n6. The comparator 230 may have an input and an output respectively coupled to the node n6 and a node n7. The register 240 may have an input and an output respectively coupled to the node n7 and a node n8. The switch sc1 may be coupled between the capacitor bank 221 and the node n8 (via the scaler 263). The switch sc2 may be coupled between the capacitor bank 222 and the node n8 (via the scaler 264). By switching of the switches sa1, sb1, sa2, and sb2, the capacitor banks 221 and 222, the comparator 230 and the register 240 may jointly implement a quantizer for quantizing the signal S5 to the signal D1 by a single-comparator time-interleaved successive approximation, which will be described later.

The delay circuit 250 may have an input and an output respectively coupled to the nodes n8 and n9, and may delay the signal D1 at the node n8 to form a delayed signal DD1 at the node n9. The path 251 coupled between the register 240 (via the delay circuit 250) and the loop filter 201 (via the scaler 261 and the sum circuit 211) may feed the delayed signal DD1 back, and may cause the delayed signal DD1 to be linearly combined with the signal V1 to form the signal S1. For example, via the path 251, the signal DD1 may be scaled by a factor c1 of the scaler 261, and be subtracted from the signal V1 to form the signal S1.

In an embodiment, the delay circuit 250 may delay the signal D1 of the register 240 by one sampling period Ts to form the delayed signal DD1. In other words, when feeding back the signal D1 to the loop filters 201 and 202, the DSM 200 according to the invention may tolerate a longer feedback delay, such as one sampling period Ts. The longer feedback delay may allow a wider time window for quantization. While longer feedback delay may degrade signal transfer function, the DSM 200 according to the invention may utilize the path 252 to implement a feedback value restoring mechanism, so as to compensate the degraded signal transfer function.

As shown in FIG. 1, the path 252 may be coupled between the register 240 (via the delay circuit 250) and the loop filter 202 (via the scaler 262 and the sum circuit 212), and may cause the delayed signal DD1 to be linearly combined with the signal S2 to form the signal S3. For example, via the path 252, the signal DD1 may be scaled by a factor c2 of the scaler 262, and be subtracted from the signal S2 to form the signal S3.

By feeding the delayed signal DD1 back to the loop filter 201 via the path 251 and feeding the delayed signal DD1 back to the loop filter 202 via the additional path 252, not only the DSM 200 may allow longer feedback delay and wider time window for quantization, but also the DSM 200 may keep its signal transfer function to be unaffected by the longer feedback delay. For example, the signal transfer function of the DSM 200 may be designed to pass bands of desired signal(s), while the noise transfer function of the DSM 200 may be designed to shape noise away from the bands of the desired signal(s).

Figure 3:
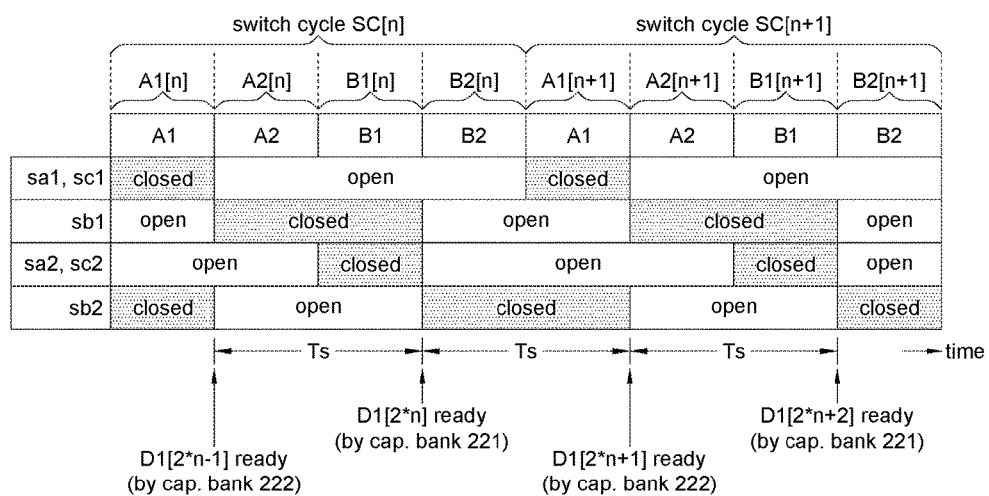
FIG. 3 illustrates an embodiment of operation timing for the DSM in FIG. 1.

In the DSM 200, the signal S5 may be quantized to the signal D1 by periodically repeating a switch cycle which may include four phases. Along with FIG. 1, please refer to FIG. 3 illustrating operation timing of the switches sa1, sb1, sc1, sa2, sb2 and sc2 in each switch cycle. As shown in FIG. 3, each switch cycle may include four phases A1, A2, B1 and B2. For convenience of description, two switch cycles SC[n] and SC[n+1] are shown in FIG. 3, the four phases A1, A2, B1 and B2 of the switch cycle SC[n] are respectively labeled as A1[n], A2[n], B1[n] and B2[n], while the four phases A1, A2, B1 and B2 of the next switch cycle SC[n+1] are respectively labeled as A1[n+1], A2[n+1], B1[n+1] and B2[n+1].

As shown in FIG. 3, during the phase A1 (e.g., A1[n] or A1[n+1]), the switch sa1 may be closed to conduct the node n5 to the capacitor bank 221, the switch sc1 may be closed to conduct the node n8 to the capacitor bank 221, and the switch sb1 may be open to stop conducting the capacitor bank 221 to the node n6. On the other hand, during the phase A1, the switch sa2 may be open to stop conducting the node n5 to the capacitor bank 222, the switch sc2 may be open to stop conducting the node n8 to the capacitor bank 222, and the switch sb2 may be closed to conduct the capacitor bank 222 to the node n6.

Hence, during the phase A1, the signal S5 may be conducted to the capacitor bank 221 via the closed switch sa1; in addition, the path 253 between the node n8 and the capacitor bank 221 may conduct the signal D1 (weighted by a factor c0 of the scaler 263) to the capacitor bank 221 via the closed switch sc1, so a linear combination (weighted sum) of the signals S5 and D1 may be sampled by the capacitor bank 221.

Figure 2B:
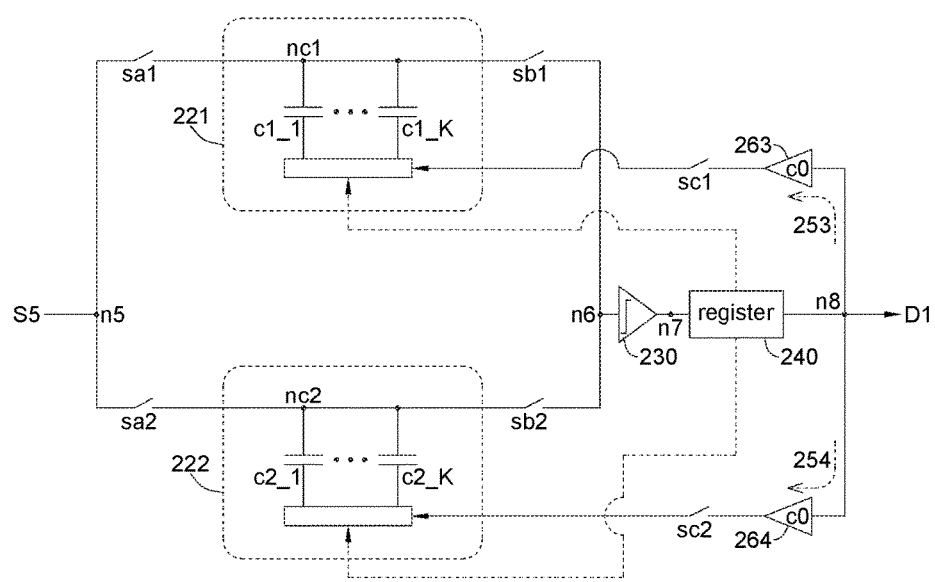

For example, as shown in FIG. 2b, the capacitor bank 221 may include a plurality of capacitors c1_1 to c1_K; top plates of the capacitors c1_1 to c1_K may be commonly coupled to a node nc1, and the switches sa1 and sb1 may be coupled to the capacitor bank 221 at the node nc1. During the phase A1, the signal S5 may be sampled at the node nc1 via the closed switch sa1. When the phase A1 ends, voltages at bottom plates of the capacitors c1_1 to c1_K may be controlled by a (weighted) sample of the signal D1 outputted by the register 240 and conducted to the capacitor bank 221 via the closed switch sc1, so electrical charges reflecting a difference between the signal S5 and the (weighted) sample of the signal D1 may be stored in the capacitor bank 221.

As shown in FIG. 3, during the phase A2 (e.g., A2[n] or A2[n+1]), the switch sa1 may be open to stop conducting the node n5 to the capacitor bank 221, the switch sc1 may be open to stop conducting the node n8 to the capacitor bank 221, and the switch sb1 may be closed to conducting the capacitor bank 221 to the node n6; on the other hand, the switches sa2 and sc2 may remain open, and the switch sb2 may be open to stop conducting the capacitor bank 222 to the node n6.

As shown in FIG. 3, during the phase B1 (e.g., B1[n] or B1[n+1]), the switches sa1 and sc1 may remain open, and the switch sb1 may remain closed; on the other hand, the switch sa2 may be closed for conducting the node n5 to the capacitor bank 222, the switch sc2 may be closed for conducting the node n8 to the capacitor bank 222, and the switch sb2 may remain open. Hence, during the phase B1, the signal S5 may be conducted to the capacitor bank 222; in addition, the path 254 between the node n8 and the capacitor bank 222 may conduct the signal D1 (weighted by a factor c0 of the scaler 264) to the capacitor bank 222, so a linear combination (weighted sum) of the signals S5 and D1 may be sampled by the capacitor bank 222.

For example, as shown in FIG. 2b, the capacitor bank 222 may include a plurality of capacitors c2_1 to c2_K; top plates of the capacitors c2_1 to c2_K may be commonly coupled to a node nc2, and the switches sa2 and sb2 may be coupled to the capacitor bank 222 at the node nc2. During the phase B1, the signal S5 may be sampled at the node nc2 via the closed switch sa2. When the phase B1 ends, the voltages at bottom plates of the capacitors c2_1 to c2_K may be controlled by a (weighted) sample of the signal D1 outputted by the register 240 and conducted to the capacitor bank 222 via the closed switch sc2, so electrical charges reflecting a difference between the signal S5 and the (weighted) sample of the signal D1 may be stored in the capacitor bank 222.

As shown in FIG. 3, during the phase B2 (e.g., B2[n] or B2[n+1]), the switch sa2 may be open to stop conducting the node n5 to the capacitor bank 222, the switch sc2 may be open to stop conducting the node n8 to the capacitor bank 222, and the switch sb2 may be closed to conduct the capacitor bank 222 to the node n6; on the other hand, the switches sa1 and sc1 may remain open, and the switch sb1 may be open to stop conducting the capacitor bank 221 to the node n6.

Based on the switch cycle (e.g., SC[n] or SC[n+1] in FIG. 3), the capacitor banks 221 and 222, the comparator 230 and the register 240 may jointly implement quantization of single-comparator time-interleaved successive approximation. For example, as shown in FIG. 3, when the phase A1[n] ends, as the signal S5 at the node n5 and a sample D1[2*n−1] of the signal D1 outputted by the register 240 may be respectively conducted to the capacitor bank 221 via the closed switch sa1 and sc1, the capacitor bank 221 may store a linear combination of the signal S5 and the sample D1[2*n−1]. During the subsequent phases A2[n] and B1[n], the capacitor bank 221 may be conducted to the comparator 230 by the closed switch sb1, so the comparator 230 and the register 240 may jointly operate with the capacitor bank 221 to form a next sample D1[2*n] of the signal D1 by successive comparing and registering.

For example, during the phases A2[n] and B1[n], the comparator 230 may sequentially obtain bits of the sample D1[2*n] by multiple comparison rounds (not shown); during each comparison round, the comparator 230 may obtain one bit of the sample D1[2*n] by comparing, the register 240 may register the obtained bit, and the voltages at the bottom plates of the capacitors c1_1 to c1_K (FIG. 2b) may be updated according to the obtained bit, so a less significant bit of the sample D1[2*n] may be obtained during a subsequent comparison round. When the phase B1[n] ends, all bits of the sample D1[2*n] D1 will be obtained and registered in the register 240 to be ready for output.

In other words, during the phases A1[n], A2[n] and B1[n], the capacitor bank 221, the comparator 230 and the register 240 may cooperate as a SAR (successive approximation register) converter to perform a SAR operation, including sampling and converting.

On the other hand, during the phase B1[n] when the SAR operation jointly performed by the comparator 230, the register 240 and the capacitor bank 221 may still be in progress, the signal S5 may be conducted to the capacitor bank 222. When the phase B1[n] ends, as the signal S5 and the sample D1[2*n] outputted by the register 240 are respectively conducted to the capacitor bank 222 via the closed switches sa2 and sc2, the capacitor bank 222 may therefore store a linear combination of the signal S5 and the sample D1[2*n]. During the subsequent phases B2[n] and A1[n+1], the capacitor bank 222 may be conducted to the comparator 230 by the closed switch sb2, so the comparator 230 and the register 240 may jointly operate with the capacitor bank 222 to obtain another sample D1[2*n+1] of the signal D1 by successive comparing and registering.

For example, during the phases B2[n] and A1[n+1], the comparator 230 may sequentially obtain bits of the sample D1[2*n+1] by multiple comparison rounds (not shown); during each comparison round, the comparator may obtained one bit of the sample D1[2*n+1] by comparing, the register 240 may register the obtained bit, and the voltages at the bottom plates of the capacitors c2_1 to c2_K (FIG. 2b) may be updated according to the obtained bit, so a less significant bit of the sample D1[2*n+1] may be obtained during a subsequent comparison round. When the phase A1[n+1] ends, the sample D1[2*n+1] of the signal D1 will be ready for output.

In other words, during the phases B1[n], B2[n] and A1[n+1], the capacitor bank 222, the comparator 230 and the register 240 may cooperate as a SAR converter to perform a SAR operation, including sampling and converting.

During the phase A1[n+1] when the SAR conversion jointly performed by the comparator 230, the register 240 and the capacitor bank 222 may still be in progress, the signal S5 may be conducted to the capacitor bank 221 via the closed switch sa1. When the phase A1[n+1] ends, the capacitor bank 221 may store a linear combination of the signal S5 and the sample D1[2*n+1]. During the following phases A2[n+1] and B1[n+1], the capacitor bank 221 may be conducted to the comparator 230 by the closed switch sb1, so the comparator 230 and the register 240 may again jointly operate with the capacitor bank 221 to obtain another sample D1[2*n+2] of the signal D1 by successive comparing and registering. In other words, during the phases A1[n+1], A2[n+1] and B1[n+1], the capacitor bank 222, the comparator 230 and the register 240 may cooperate again to perform another SAR operation, including sampling and converting.

As shown in FIG. 3, although each SAR operation may only provide one sample of the signal D1 and a time interval between two consecutive samples of the signal D1 may be one sampling period Ts, a time window for performing a SAR operation may be longer than one sampling period, since different SAR operations may be arranged in a time-interleaved manner by using different capacitor banks. For example, while a SAR operation by the comparator 230, the register 240 and capacitor bank 221 may be performed during the phases A1[n], A2[n], B1[n] and B2[n], another SAR operation by the comparator 230, the register 240 and capacitor bank 222 may be performed during the phases B1[n], B2[n], A1[n+1] and A2[n+1]; i.e., two different SAR operations utilizing different capacitor banks may partially overlap to be time-interleaved.

Because the time window of each SAR operation may be longer than one sampling period Ts, the DSM 200 according to the invention may satisfy high-speed and/or high-throughput demands of advanced signal processing without using quantizer of high speed, high cost, high complexity, high power and/or high layout area. Moreover, because the SAR operations utilizing different capacitor banks may share the same comparator 230 and the same register 240, power consumption, layout area and hardware complexity of the DSM 200 may be further reduced.

Figure 4:
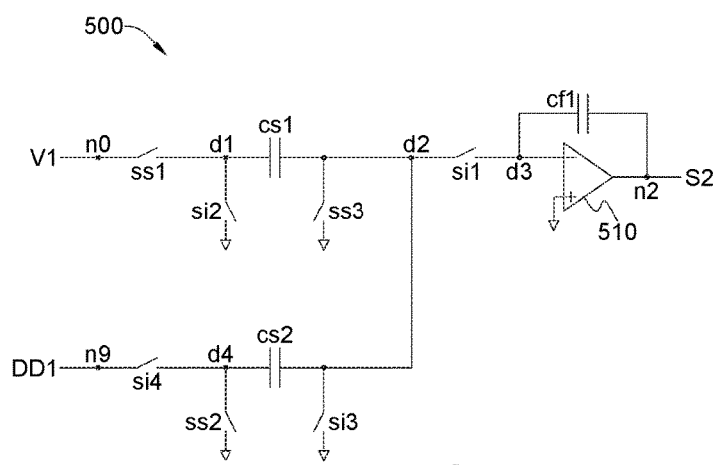
FIG. 4 illustrates an embodiment of a filter circuit which may be utilized to implement a portion of the DSM in FIG. 1.

Along with FIG. 1 and FIG. 3, please refer to FIG. 4 illustrating a filter circuit 500 according to an embodiment of the invention. In an embodiment, the loop filter 201, the sum circuit 211 and the scaler 261 in FIG. 1 may be implemented by the filter circuit 500 in FIG. 4. The filter circuit 500 may include switches ss1, ss2, ss3, si1, si2, si3 and si4, an operational amplifier 510, and capacitors cs1, cs2 and cf1. The switch ss1 may be coupled between the node n0 and a node d1. The capacitor cs1 may be coupled between the node d1 and a node d2. The switch si1 may be coupled between the node d2 and a node d3. The operational amplifier 510 may have an input terminal (labeled by "−" in FIG. 4) at the node d3, an inverted input terminal (labeled by "+"), and an output terminal at the node n2. The capacitor cf1 may be coupled between the nodes d3 and n2. The switch si4 may be coupled between the node n9 and a node d4. The capacitor cs2 may be coupled between the nodes d4 and d2.

During the phases A1 and B1 (FIG. 3) of each switch cycle, the switch ss1 may be closed to conduct the input signal V1 to the capacitor cs1, and the switch si1 may be open to stop conducting between the capacitor cs1 and the node d3; also, the switches ss2 and ss3 may be closed, and the switches si2, si3 and si4 may be open. Hence, during the phases A1 and B1, the signal V1 may be sampled by the capacitor cs1.

During the phases A2 and B2 of each switch cycle, the switch si1 may be closed to conduct the capacitor cs1 to the node d3, and the switch ss1 may be open to stop conducting between the input signal V1 and the capacitor cs1; also, the switches ss2 and ss3 may be open, and the switches si2, si3 and si4 may be closed. Hence, during the phases A2 and B2, the previously sampled signal V1 and a sample of the signal DD1 may be linearly combined and accumulated by the capacitor cf1.

To sum up, the invention may provide a DSM with quantization of single-comparator time-interleaved successive approximation and feedback value restoring mechanism; the DSM according to the invention may therefore allow feedback delay as long as one sampling period without degrading the signal transfer function, and may satisfy demands of high speed, high accuracy and high quantization resolution by circuitry of low speed, low cost, low power, low layout area and low complexity.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A delta-sigma modulator (DSM) comprising:
   a first loop filter for filtering a first signal to a second signal;
   a second loop filter for filtering a third signal;
   a comparator;
   a register coupled to the comparator;
   a first capacitor bank and a second capacitor bank parallelly coupled between the second loop filter and the comparator;
   a first path coupled between the register and the first loop filter, causing a delayed signal to be linearly combined with an input signal to form the first signal; and
   a second path coupled between the register and the second loop filter, causing the delayed signal to be linearly combined with the second signal to form the third signal; wherein:
   the delayed signal is formed by delaying an output signal of the register; and
   during a second phase and a third phase, the first capacitor bank is conducted to the comparator; and
   during a fourth phase and a repeated first phase, the second capacitor bank is conducted to the comparator.

2. The DSM of claim 1 further comprising:
   a first sum circuit coupled to the input signal, the delayed signal and the first loop filter, for linearly combining the delayed signal and the input signal.

3. The DSM of claim 1 further comprising:
   a delay circuit coupled to the register, for delaying the output signal to form the delayed signal.

4. The DSM of claim 3, wherein:
   the output signal is sampled at a sampling period; and
   the delay circuit delays the output signal by one said sampling period to form the delayed signal.

5. The DSM of claim 1 further comprising:
   a second sum circuit coupled to the delayed signal, the first loop filter and the second loop filter, for linearly combining the delayed signal and the second signal.

6. The DSM of claim 1, wherein:
   during a first phase, a fifth signal resulting from the second loop filter is conducted to the first capacitor bank;
   during the third phase, the fifth signal is conducted to the second capacitor bank.

7. The DSM of claim 6, wherein the second loop filter filters the third signal to a fourth signal, and the DSM further comprises:
   a third sum circuit coupled to the first loop filter and the second loop filter, for linearly combining the second signal and the fourth signal to form the fifth signal.

8. The DSM of claim 6 further comprising:
   a third path conducting the output signal to the first capacitor bank during the first phase; and
   a fourth path conducting the output signal to the second capacitor bank during the third phase.

9. The DSM of claim 8, wherein:
   the third path stops conducting the output signal to the first capacitor bank during the third phase; and
   the fourth path stops conducting the output signal to the second capacitor bank during the first phase.

10. The DSM of claim 1, wherein the second loop filter is coupled between the first loop filter and a fifth node, and the DSM further comprises:
    a first front switch coupled between the fifth node and the first capacitor bank; and
    a second front switch coupled between the fifth node and the second capacitor bank; wherein
    during a first phase, the first front switch is closed to conduct the fifth node to the first capacitor bank, and the second front switch is open to stop conducting the fifth node to the second capacitor bank; and
    during the third phase, the second front switch is closed to conduct the fifth node to the second capacitor bank, and the first front switch is open to stop conducting the fifth node to the first capacitor bank.

11. The DSM of claim 10, wherein:
    during the second phase and the fourth phase, the first front switch and the second front switch are open.

12. The DSM of claim 1 further comprising:
    a first back switch coupled between the first capacitor bank and the comparator; and
    a second back switch coupled between the second capacitor bank and the comparator;
    during the second phase and the third phase, the first back switch is closed to conduct the first capacitor bank to the comparator, and the second back switch is open to stop conducting the second capacitor bank to the comparator.

13. The DSM of claim 12, wherein:
    during a first phase and the fourth phase, the first back switch is open to stop conducting the first capacitor bank to the comparator, and the second back switch is closed to conduct the second capacitor bank to the comparator.

14. The DSM of claim 12, wherein the first loop filter is implemented by a filter circuit which comprises:
    a first interior switch coupled between the input signal and a first interior node;
    a first interior capacitor coupled between the first interior node and a second interior node;
    a second interior switch coupled between the second interior node and a third interior node;

an operational amplifier having an input terminal at the third interior node and an output terminal; and a second interior capacitor coupled between the input terminal and the output terminal; wherein during a first phase and the third phase, the first interior switch is closed to conduct the input signal to the first interior capacitor, and the second interior switch is open to stop conducting the first interior capacitor to the input terminal; and during the second phase and the fourth phase, the second interior switch is closed to conduct the first interior capacitor to the input terminal, and the first interior switch is open to stop conducting the input signal to the first interior capacitor.

15. The DSM of claim 1, wherein the first loop filter is a first-order integrator.

16. A DSM comprising:

a first sum circuit coupled to an input node, a ninth node and a first node;

a first loop filter coupled to the first node and a second node;

a second sum circuit coupled to the second node, the ninth node and a third node;

a second loop filter coupled to the third node and a fourth node;

a third sum circuit coupled to the second node, the fourth node and a fifth node;

a first capacitor bank and a second capacitor bank;

a first front switch coupled between the fifth node and the first capacitor bank;

a second front switch coupled between the fifth node and the second capacitor bank;

a first back switch coupled between the first capacitor bank and a sixth node;

a second back switch coupled between the second capacitor bank and the sixth node;

a comparator coupled to the sixth node and a seventh node;

a register coupled to the seventh node and an output node; and a delay circuit coupled to the output node and the ninth node.

17. The DSM of claim 16, wherein:

when the first front switch is closed, the second front switch is open; and when the second front switch is closed, the first front switch is open.

18. The DSM of claim 16, wherein:

when the first front switch is closed, the first back switch is open; and when the first back switch is closed, the first front switch is open.

19. The DSM of claim 16 further comprising:

a first feedback switch coupled between the output node and the first capacitor bank; and a second feedback switch coupled between the output node and the second capacitor bank.

20. A DSM comprising:

a first loop filter for filtering a first signal to a second signal;

a second loop filter for filtering a third signal;

a comparator;

a register coupled to the comparator;

a first capacitor bank and a second capacitor bank parallelly coupled between the second loop filter and the comparator;

a delay circuit coupled to the register, for delaying an output signal of the register to form a delayed signal;

a first path coupled between the register and the first loop filter, causing the delayed signal to be linearly combined with an input signal to form the first signal; and a second path coupled between the register and the second loop filter, causing the delayed signal to be linearly combined with the second signal to form the third signal.

21. The DSM of claim 20, wherein the output signal is sampled at a sampling period, and the delay circuit delays the output signal by one said sampling period to form the delayed signal.

22. A DSM comprising:

a first loop filter for filtering a first signal to a second signal;

a second loop filter for filtering a third signal;

a comparator;

a register coupled to the comparator;

a first capacitor bank and a second capacitor bank parallelly coupled between the second loop filter and the comparator;

a first back switch coupled between the first capacitor bank and an input of the comparator;

a second back switch coupled between the second capacitor bank and the input of the comparator;

a first path coupled between the register and the first loop filter, causing a delayed signal to be linearly combined with an input signal to form the first signal; and a second path coupled between the register and the second loop filter, causing the delayed signal to be linearly combined with the second signal to form the third signal; wherein:

the delayed signal is formed by delaying an output signal of the register.

* * * * *